(12) United States Patent
Lin et al.

(10) Patent No.: US 6,304,482 B1
(45) Date of Patent: Oct. 16, 2001

(54) APPARATUS OF REDUCING POWER CONSUMPTION OF SINGLE-ENDED SRAM

(75) Inventors: Hung-Ming Lin, Hsin Chu; Hung-Ta Pai, Tai Chung, both of (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 0 days.

(21) Appl. No.: 09/716,247

(22) Filed: Nov. 21, 2000

(51) Int. Cl.$^7$ .................................................. G11C 11/40
(52) U.S. Cl. ............................................. 365/154; 365/227
(58) Field of Search .................................. 365/154, 156, 365/226, 227

(56) References Cited

U.S. PATENT DOCUMENTS

| | | | |
|---|---|---|---|
| 5,805,496 | * | 9/1998 | Batson et al. ........................ 365/154 |
| 5,831,896 | * | 11/1998 | Lattimore et al. ................... 365/154 |
| 5,986,923 | * | 11/1999 | Zhang et al. ........................ 365/154 |

* cited by examiner

*Primary Examiner*—Son Mai
(74) *Attorney, Agent, or Firm*—Birch, Stewart, Kolasch & Birch, LLP

(57) ABSTRACT

An apparatus of reducing power consumption of a single-ended Static Random Access Memory (hereinafter referred as SRAM) is provided. The apparatus consists of at least an extra column of status memory cell and a majority detector by which a bit status of a written data is detected and by which the value of the bit status is written into the extra column of status memory cell. The apparatus further includes a data scrambler by which the written data is converted into a storage data with a minority of 0 bits based on the value of bit status and by which the storage data is written into the main single-ended SRAM cell. The apparatus further includes a data de-scrambler by which the storage data in the main single-ended SRAM cell is converted into its original format based on the value of bit status stored in the extra column of memory cell and by which the data in its original format is output. Since the data stored in the main single-ended SRAM cell has a majority of 1 bits, the apparatus can reduce the power consumption of the single-ended SRAM.

10 Claims, 5 Drawing Sheets

APPARATUS OF REDUCING POWER CONSUMPTION OF SINGLE-ENDED SRAM

BACKGROUND OF THE INVENTION

A. Field of the Invention

The present invention relates to an apparatus of reducing power consumption of a single-ended Static Random Access Memory.

B. Description of the Related Art

FIG. 1 shows a circuit diagram of memory cell in a conventional single-ended Static Random Access Memory (hereinafter referred as SRAM). When a word line is asserted, a single bit data is either written into or read from an inverter 112 of a memory cell 110 connected with the word line through a bit line. In comparison with a two-ended SRAM using six transistors, a single-ended SRAM occupies less chip area with relatively low manufacturing cost because a single-ended SRAM consists of five transistors that are included in two inverters 111, 112 and one pass transistor 113.

FIG. 2 shows a schematic structural diagram of a memory cell array using single-ended SRAM for data storage. The SRAM cell array 100 consists of memory cells 110 arranged in a form of array, and "a word line and a bit line" for controlling both the data writing and the data reading of the memory cells 110. Same row of memory cells 110 are connected to the same word line while same column of memory cells 110 are connected to the same bit line in the SRAM cell array 100. Therefore, when a word line is asserted, the data is written into or read from the same row of memory cells 110 through different bit lines. Since every bit line connects many memory cells 110, a relatively higher capacitance is constituted therefor. Thus, it takes relatively long time for a bit line to shift its status from 0 bit to 1 bit or vice versa.

As shown in FIG. 3, in order to increase the speed of shifting status of a bit line, a load and pre-charging cell is added into the bit line. Before data reading or data writing, the pre-charging cell 140 will charge the bit line to be a status of 1 bit. Then, if the reading data or writing data is 1 bit, the status of the bit line will remain as 1 bit, and, on the other hand, if the reading data or writing data is 0 bit, the status of the bit line will be shifted to 0 bit. Since the bit lines have relatively higher capacitance, it will consume a considerable amount of power for a bit line to shift the status from 1 bit to 0 bit, or vice versa. Thus, when a single-ended SRAM with large capacity is employed, the power consumption has become a serious problem. Therefore, if it is possible to reduce the ratio of 0 bits of the data to be stored in the single-ended SRAM, it can reduce the power consumption thereby.

SUMMARY OF THE INVENTION

Aiming at the problem mentioned above, one of objects of the present invention is to provide an apparatus of reducing power consumption of single-ended SRAM.

Another object of the present invention is to provide an apparatus of reducing power consumption of single-ended SRAM that a written data is converted into a storage data with a majority of 1 bits. Then, the storage data is stored in the single-ended SRAM in order to reduce the power consumption of the single-ended SRAM.

The apparatus of reducing power consumption of single-ended SRAM according to the present invention consists of at least an extra column of SRAM, a majority detector for detecting a bit status of the written data and for writing the value of the bit status into the extra column of SRAM. The apparatus further includes a data scrambler that converts the written data into a storage data with a minority of 0 bits based on the bit status of the written data and writes the storage data into the single-ended SRAM. And, the apparatus further includes a data de-scrambler that converts the storage data read from the single-ended SRAM into its original format based on the correspondent bit status stored in the extra column of SRAM and outputs the data in its original format. Because a majority of 1 bits is kept in the storage data stored in the single-ended SRAM, thereby it can reduce the power consumption of the single-ended SRAM.

The mentioned objects, various other objects, advantages, and features of the present invention will be more fully understood from the following detailed description of the preferred aspects of the present invention when considered in connection with the accompanying drawings.

BRIEF DESCRIPTION OF THE DRAWINGS

These and other objects and advantages of the present invention will become apparent with reference to the following description and accompanying drawings as follows.

DETAIL DESCRIPTION OF THE INVENTION

The preferred aspects of embodiments of an apparatus of reducing power consumption of single-ended SRAM according to the present invention is illustrated with reference of accompanying drawings as follows.

Figure 1:
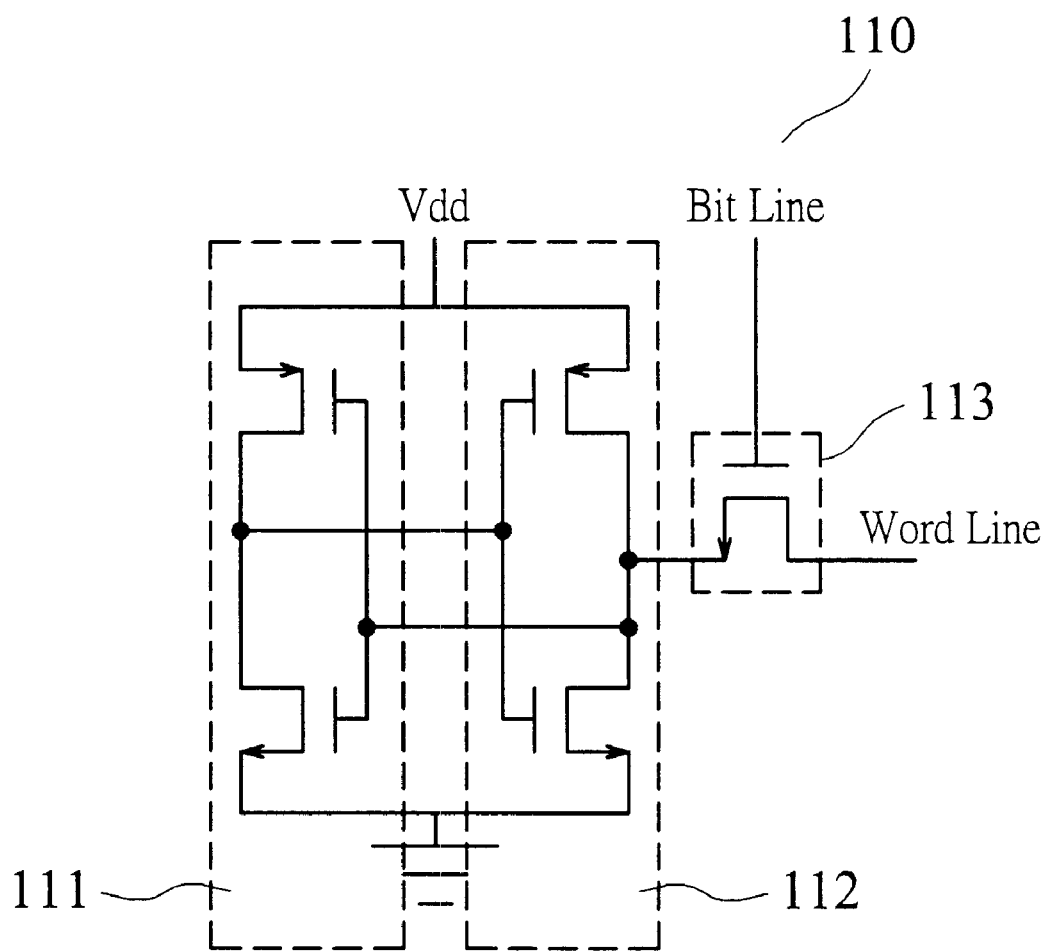
FIG. 1 is a circuit diagram of memory cell of a single-ended SRAM of the prior art.
Figure 2:
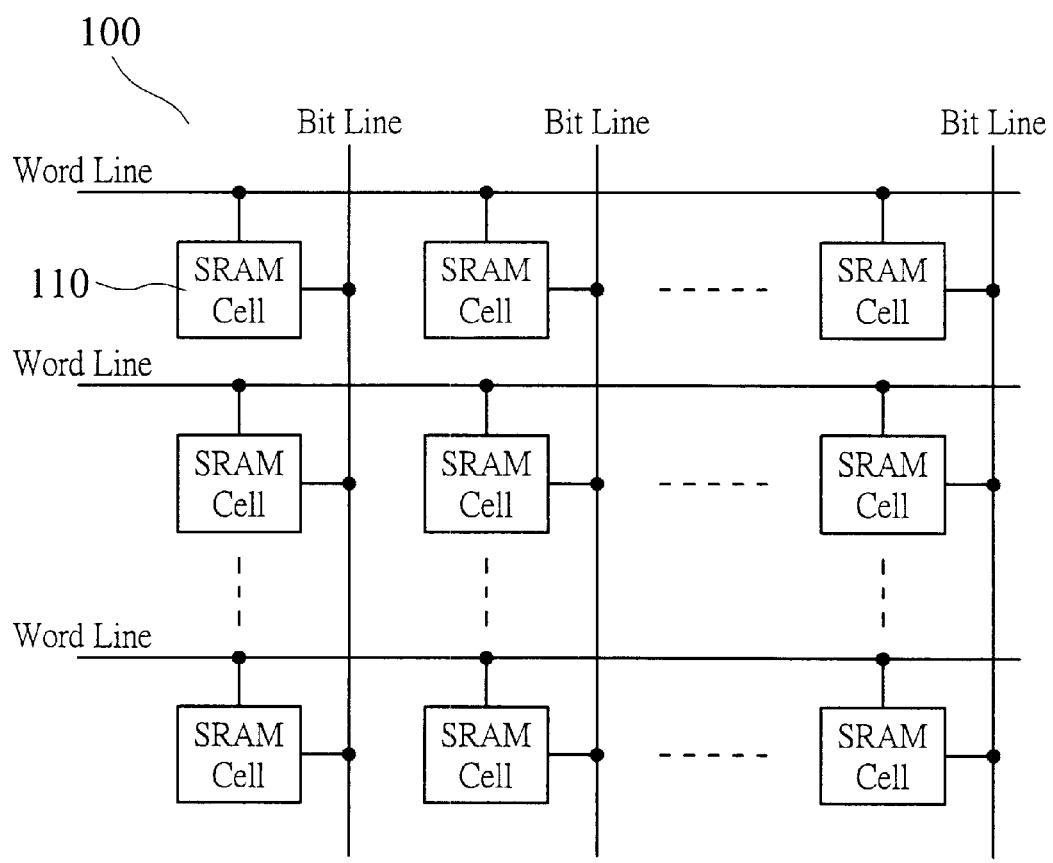
FIG. 2 is a schematic structural diagram of a SRAM cell array for data storage.
Figure 3:
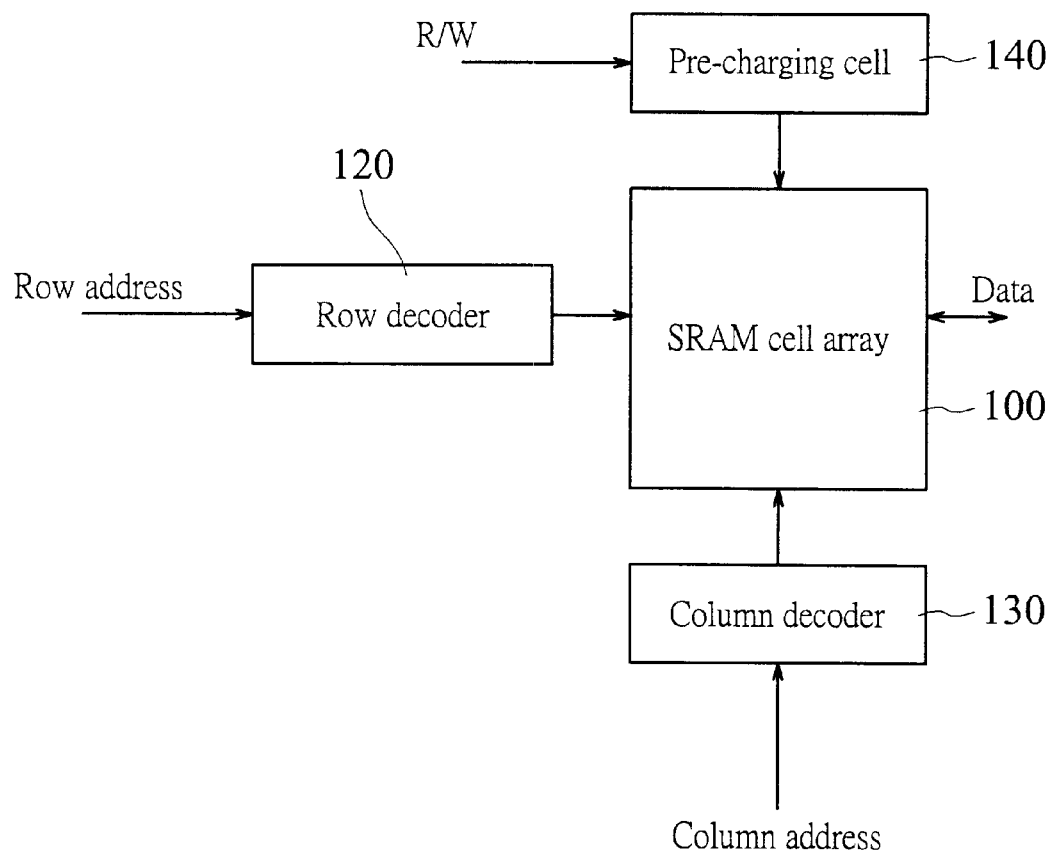
FIG. 3 is a schematic structural diagram of a bit line in a SRAM cell array with an added bit line load and pre-charging cell.
Figure 4:
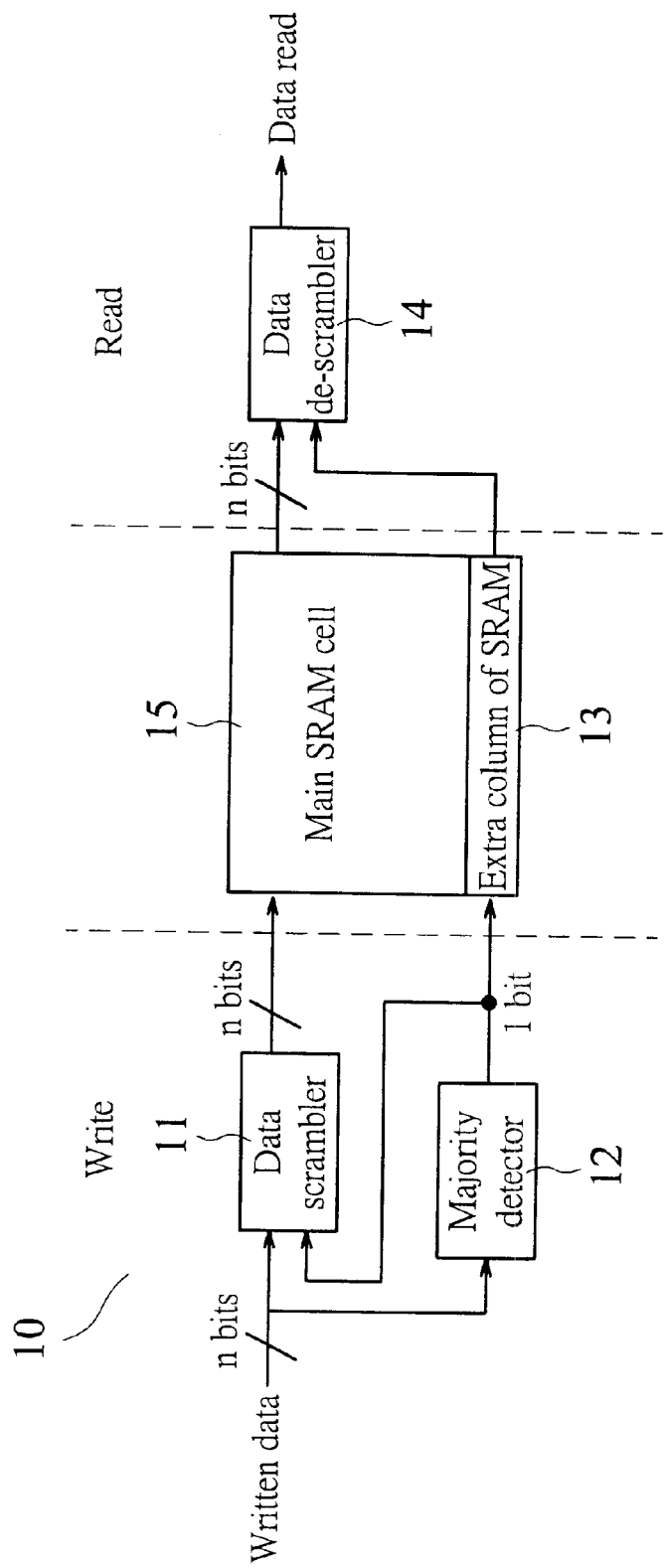
FIG. 4 is a block diagram of an apparatus of reducing power consumption of single-ended SRAM according to the present invention.

The apparatus of reducing power consumption of single-ended SRAM according to the present invention keeps a majority of 1 bits in the storage data to be written into the single-ended SRAM so as to reduce the power consumption of the single-ended SRAM. FIG. 4 is a block diagram of an apparatus of reducing power consumption of single-ended SRAM according to the present invention. As shown in FIG. 4, the apparatus 10 consists of a main SRAM cell 15 to store a data, an extra column of SRAM 13 to store a bit status, a majority detector 12, a data scrambler 11, and a data de-scrambler 14.

The main SRAM cell 15 is a MN array of memory cell and the extra column of SRAM 13 is a MX array of memory cell wherein N is the bus bandwidth of data writing while X is the bandwidth of the bit status. The main SRAM cell 15 is to store the data as required by system while the extra column of SRAM 13 is to store the values of bit status determined and processed by the majority detector 12. In this aspect of the embodiment, N is set as 64 and X is set as 1. Certainly, if it is to increase the ratio on reduction of power consumption, N can be divided into two groups and X can be set as 2 in order to store two sets of information. Since the main SRAM cell 15 and the extra column of SRAM 13 have M rows of memory address respectively, the same address line can select the same row of memory address in both the main SRAM cell 15 and the extra column of SRAM 13.

Figure 5:
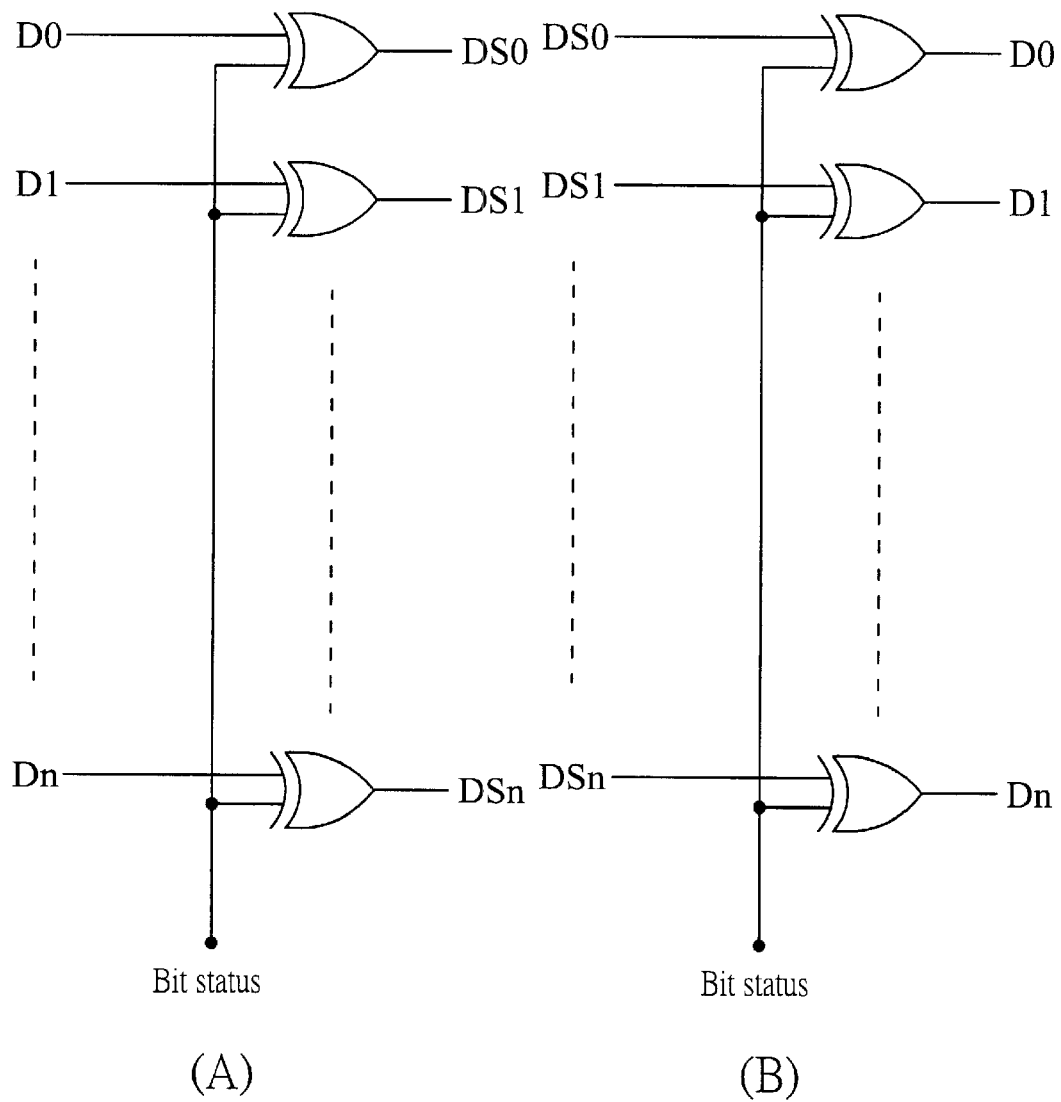
FIG. 5 shows an aspect of embodiments of data scrambler and data de-scrambler of FIG. 4 wherein FIG. 5 (A) is a data scrambler and FIG. 5 (B) is a data de-scrambler.

As shown in FIG. 4, the majority detector 12 receives a written data and judges whether the bit status of the written data is the majority bit of 1 bit or 0 bit. Afterward, the value of determination on the bit status is written into the extra column of SRAM 13 and is also output to the data scrambler 11 by the majority detector 12. A storage data is converted from the written data in an opposite format or is kept in the same format as that of the written data by the data scrambler 11 based on the correspondent value of bit status determined by the majority detector 12. Then, the storage data is written into the main SRAM cell 15 by the data scrambler 11. The data scrambler can be an XOR gate, an XNOR gate, or other logical process components capable of executing the same function. FIG. 5 (A) shows an aspect of embodiment using an XOR gate as the data scrambler 11. If the value of bit status is determined as the majority of data bits of the written data, an XNOR gate can be used as the data scrambler 11. On the other hand, if the value of bit status is determined as the minority of data bits of the written data, an XOR gate can be used as the data scrambler 11. Therefore, when 0 bit is the majority of data bits of the written data, the data scrambler 11 will convert the written data into a storage data with an opposite format and then write the storage data into the main SRAM cell 15. And, when 0 bit is the minority of data bits of the written data, the data scrambler 11 will write this written data into the main SRAM cell 15 directly.

Furthermore, the data read from the main SRAM cell is output in the opposite format or in the same format by the data de-scrambler 14 based on the correspondent value of bit status stored in the extra column of SRAM 13. The data de-scrambler 14 can be an XOR gate, an XNOR gate or other logical process components capable of executing the same function. FIG. 5 (B) shows an aspect of embodiment using an XOR gate as the data de-scrambler 14.

The sequence of actions according to the present invention is described in detail as follows. When a system is to write a written data into the apparatus 10, the written data is output to the data scrambler 11 and the majority detector 12 simultaneously. Then, the majority detector 12 is to determine the value of bit status of the written data, for example, based on the majority of data bits of the written data. After the value of bit status being determined, the majority detector outputs this value to the data scrambler 11 and writes this value into the extra column of SRAM 13. Afterward, once the data scrambler 11 receives the value of bit status, the data scrambler 11 writes the written data into the main SRAM cell 15 in an opposite format or in a same format based on the value of bit status received. When the stored data is to be read from the main SRAM cell 15, the stored data and the correspondent value of bit status is read by the data de-scrambler 14 simultaneously. Then, the data de-scrambler 14 outputs the stored data in an opposite format or in a same format based on the correspondent value of bit status.

Effect of Invention

The present invention provides an apparatus of reducing power consumption of single-ended SRAM. The apparatus converts the written data into a storage data in a format with a majority of 1 bit during data writing and converts the storage data back to its original format during data reading so that the apparatus can effectively reduce the power consumption of the single-ended SRAM.

While the scheme of the present invention has been described with reference to a preferred aspect of embodiments mentioned above, it should not be considered as a limitation of the scope of the present invention but an illustration of the technical contents. Various possible modifications and alterations could be performed by persons who are skilled in the art without departing from the principles of the present invention. For example, although the majority detector only determines one value of bit status in the aspect of embodiment mentioned above, it is also workable to divide the written data into two or more groups. And, the majority detector can determine two or more values of bit status according to two or more groups of written data in order to increase the ratio of 1 bit of the storage data being stored in the single-ended SRAM. It is intended that the following claims define the present invention and that the structure within the scope of these claims and their equivalents be covered thereby.

What is claimed is:

1. An apparatus of reducing power consumption of single-ended Static Random Access Memory (hereinafter referred as SRAM) comprising:
   an extra column of memory cell for storing bit status at least;
   a majority detector that is to determine the value of bit status of a written data and to write said value of bit status into said extra column of memory cell;
   a data scrambler that is to convert said written data into a storage data in a format with a minority of 0 bits based on said correspondent value of bit status and to write said storage data into said single-ended SRAM; and
   a data de-scrambler that is to convert said storage data read from said single-ended SRAM into its original format based on said correspondent value of bit status stored in said extra column of memory cell and to output the data in its original format.

2. The apparatus of reducing power consumption of single-ended SRAM of claim 1 wherein said value of bit status is determined to be the minority of data bits of said written data.

3. The apparatus of reducing power consumption of single-ended SRAM of claim 2 wherein said data scrambler is an XOR gate.

4. The apparatus of reducing power consumption of single-ended SRAM of claim 1 wherein said value of bit status is determined to be the majority of data bits of said written data.

5. The apparatus of reducing power consumption of single-ended SRAM of claim 4 wherein said data scrambler is an XNOR gate.

6. A apparatus of reducing power consumption of single-ended SRAM comprising:
   a detection step that a bit status of a written data is determined and said bit status is written into a status memory cell;
   a data writing step that said written data is converted into a storage data in a format with a minority of 0 bits based on said bit status and said storage data is written into a single-ended SRAM cell; and
   a data reading step that said storage data is read from said single-ended SRAM cell and said correspondent bit status is read from said status memory cell, and said storage data is converted based on said correspondent bit status and then is output after the conversion.

7. The apparatus of reducing power consumption of single-ended SRAM of claim 6 wherein the value of said bit status is determined to be the minority of data bits of said written data.

8. The apparatus of reducing power consumption of single-ended SRAM of claim 7 wherein said data writing step is to process said written data by an XOR operation with respect to said value of bit status.

9. The apparatus of reducing power consumption of single-ended SRAM of claim 6 wherein the value of said bit status is determined to be the majority of data bits of said written data.

10. The apparatus of reducing power consumption of single-ended SRAM of claim 9 wherein said data writing step is to process said written data by an XNOR operation with respect to said value of bit status.

* * * * *